(12) United States Patent
Vang et al.

(10) Patent No.: US 6,239,422 B1
(45) Date of Patent: May 29, 2001

(54) VARIABLE ELECTRODE TRAVELING WAVE METAL-SEMICONDUCTOR-METAL WAVEGUIDE PHOTODETECTOR

(75) Inventors: Timothy A. Vang, San Dimas; David C. Scott, Lakewood, both of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/265,913

(22) Filed: Mar. 10, 1999

(51) Int. Cl.$^7$ ............................. G01J 1/42; H01L 31/00
(52) U.S. Cl. ........................ 250/208.2; 250/214.1
(58) Field of Search .................. 250/208.2, 214.1, 250/227.11; 359/195, 189

(56) References Cited

U.S. PATENT DOCUMENTS

| | | | |
|---|---|---|---|
| 4,099,132 | * 7/1978 | Kantorowicz | 330/5 |
| 4,602,183 | * 7/1986 | Okamoto et al. | 310/313 |
| 4,635,008 | * 1/1987 | Solie | 333/195 |
| 4,642,620 | * 2/1987 | Togashi et al. | 340/713 |
| 4,772,931 | 9/1988 | Rogers | 357/30 |
| 5,270,532 | 12/1993 | Hietala et al. | 250/214.1 |
| 5,404,006 | 4/1995 | Schaffner et al. | 250/208.2 |
| 5,572,014 | 11/1996 | Wu et al. | 250/208.2 |
| 5,831,492 | * 11/1998 | Solie | 333/193 |

OTHER PUBLICATIONS

Solie, Leland, P; Weighed Tapered Spud Saw Devices, PCT, International Publication # WO 97/10646, published Mar. 20, 1997.*

* cited by examiner

*Primary Examiner*—Ricky Mack
(74) *Attorney, Agent, or Firm*—Michael S. Yatsko

(57) ABSTRACT

A metal-semiconductor-metal photodetector (18) is provided including an optical waveguide (22) disposed on a substrate (28) and an array of metal-semiconductor-metal photodiodes (20) coupled to the optical waveguide (22). An absorber (30) is disposed between the photodiodes (20) and the optical waveguide (22) and a transmission line (26) is coupled to the photodiodes (20). Each of the photodiodes (20) includes an electrode (24) having a plurality of interdigitated electrode fingers (31) wherein a width of each finger (31) and a gap between adjacent fingers (31) tapers from one end of the electrode (24) to the other. Preferably the rate of tapering corresponds to an exponential rate of optical power decay through the photodiode (20). In this way, both the photocurrent density in the fingers (31) and the uniformity of the electric field underneath the electrodes (24) are optimized.

16 Claims, 4 Drawing Sheets

VARIABLE ELECTRODE TRAVELING WAVE METAL-SEMICONDUCTOR-METAL WAVEGUIDE PHOTODETECTOR

This invention was made with Government support under contract. The government may have certain rights in this invention.

BACKGROUND OF THE INVENTION

1. Technical Field

This invention generally relates to photodetectors and, more particularly, to a traveling wave photodetector having a plurality of metal-semiconductor-metal electrodes formed thereon with a tapering electrode finger width and gap configuration.

2. Discussion

Fiber optic links are employed in a myriad of modem applications. High frequency optical detectors are one of the primary components that dictate the performance of a fiber optic link. In order to redue the insertion loss of radio frequencies, increase the spurious free dynaic range, and increase the signal-to-noise ratio of the link, the photodetector must accommodate high optical powers. The performance of photodetectors for microwave and millimeter wave applications is characterized by their bandwidth, optical-to-electrical conversion efficiency, and maximum output photocurrent. The maximum output photocurrent can be specified at the point of catastrophic failure or at 1 dB compression, whichever occurs first.

Several approaches have been proposed in the prior art to increase these figures of merit including traveling wave photodetectors, see, K. S. Giboney et. al., "Traveling Wave Photodetectors," IEEE Photonics Technology Letters, Volume 4, pages 1363–1365 (1992) and velocity-matched distributed photodetectors, see, L. Y. Lin et. al., "High-Power High-Speed Photodetectors—Design, Analysis, and Experimental Demonstration," IEEE Transactions on Microwave Theory and Techniques, Volume 45, pages 1320–1330 (1997). In these approaches, the photodetector comprises an optical waveguide and a microwave transmission line. According to this configuration, there is a co-propagation of an optical wave and an induced microwave signal which, when properly matched, travel in-phase down the length of the detector.

By matching the group velocity between the microwave and optical signals, the photodetector can be made electrically long while maintaining bandwidths in excess of a few hundred GHz. The excessively long length of the photodetector provides two key benefits. First, the optical-to-electrical conversion efficiency can be made to approach the quantum limit. Second, the absorbed optical power density can be kept small thereby circumventing saturation and/or catastrophic failure so that the maximum output photocurrent can be increased. Photocurrents in excess of 50 mA have been previously reported by Lin et. al.

Referring to FIG. 2, one of the more promising variations of these velocity-matched distributed photodetectors is illustrated. The photodetector consists of an array of Metal-Semiconductor-Metal (MSM) photodiodes 20 serially connected by an integrated passive semiconductor optical waveguide 22. The electrode structure array consists of the interdigitated electrodes 24 of the photodiode 20 connected to a Coplanar Strips (CPS) transmission line 26.

Referring to FIG. 7, refers to a close-up view of a single MSM waveguide photodetector for the array. As illustrated, the photodiode 202 is grown on a semi-insulating InP substrate 210. In operation, intensity modulated light (illustrated as the large block arrow) propagates down the optical waveguide 204 and couples into the electrodes 206 via evanescent coupling. As the intensity modulated light is absorbed by a thin semiconducting absorbing layer 30 (FIG. 4), a microwave signal is generated at the frequency of the optical intensity modulation and propagates down the transmission line 208. The promise of this variation is due to the fact that photodiodes with bandwidths in excess of 300 GHz have been demonstrated, see, S. Y. Chou et. al., "Nanoscale Terahertz Metal-Semiconductor-Metal Photodetectors," EEEE J. Quantum Electron, Volume 28, Number 10, pages 2358–2368 (1992). In addition, Metal-Semiconductor-Metal structures have superior microwave transmission loss characteristics compared to p-i-n photodetectors due to the lack of heavily doped p and n regions.

Referring now to FIG. 8, a cross-sectional view of the conventional photodiode 202 is illustrated. As can be seen, according to the prior art, the width w of each electrode finger 212 and the gap g between the fingers 212 remains constant down the entire length of the photodiode 202. Since optical power decays exponentially down the length of the photodiode 202, the amount of photocurrent that the fingers 212 are required to handle also decays exponentially. A consequence of this is that finger 214 will fail first and the subsequent fingers 212 down the length of the photodiode 202 are all underutilized.

In addition, the frequency response of conventional detectors such as the photodiode 202 is limited by the time it takes for the optically generated electron-hole pairs to travel to a finger 212. Typical electric field lines are shown in FIG. 8 and are representative of alternately charged metal lines. As the electron-hole pairs are generated in the absorption layer 216 of the photodiode 202, the carriers are separated from one another by the electric field and are accelerated towards oppositely charged fingers 212. The strength of the electric field under the fingers 212 and the distance the carriers must travel limits the frequency response.

The 1 dB compression point of the photocurrent is also dependent on the electric field strength in the absorbing layer of the fingers 212. In FIG. 8, it can be seen that directly underneath the center of each of the fingers 212 are regions of low electric field strength. Carriers that are generated in these regions experience longer transit-times thereby degrading the frequency response of the photodiode 202 and reducing the 1 dB compression point of the photocurrent.

From the above, it can be appreciated that the prior investigations of distributed detectors have focused on the appropriate periodic loading of the Metal-Semiconductor-Metal photodiodes 202 on the transmission line 208 to achieve the velocity match between the optical wave and the induced microwave. Although there has been a significant amount of work on top-illuminated Metal-Semiconductor-Metal photodiodes, very little work has addressed the individual Metal-Semiconductor-Metal photodiodes in this waveguide configuration. To date, all implementations of the Metal-Semiconductor-Metal interdigitated electrodes have consisted of uniformly spaced electrode fingers and electrode finger widths.

To reduce the regions of low electric field strength in the absorbing layer, it is desirable to maintain a high aspect ratio of gap to finger width, $r=g/w$. To maintain short carrier transit-times (large bandwidths), the gap between the fingers 212 must also be kept small. As a result, to obtain a high aspect ratio, the width of the fingers 212 must become increasingly small. Unfortunately, as the width of the fingers 212 is decreased, the photocurrent density in each finger 212 increases causing the photodiode 212 to fail at lower output photocurrents.

In view of the foregoing, it would be desirable to provide an electrode design to significantly improve the performance of the waveguide coupled metal-semiconductor-metal photodiode. More particularly, it would be desirable to provide an electrode design that will improve the inherent trade-off between electric field uniformity in the absorbing layer and photocurrent density in the metal-semiconductor-metal electrode fingers.

SUMMARY OF THE INVENTION

The above and other objects are provided by a metal-semiconductor-metal photodetector including an optical waveguide disposed on a substrate and an array of metal-semiconductor-metal photodiodes coupled to the optical waveguide. An absorber is disposed between the photodiodes and the optical waveguide and a transmission line is coupled to the photodiodes. Each of the photodiodes includes an electrode having a plurality of interdigitated electrode fingers wherein a width of each finger and a gap between adjacent fingers tapers from one end of the electrode to the other. Preferably the rate of tapering corresponds to an exponential rate of optical power decay through the photodiode. In this way, both the photocurrent density in the fingers and the uniformity of the electric field underneath the electrodes are optimized.

BRIEF DESCRIPTION OF THE DRAWINGS

In order to appreciate the manner in which the advantages and objects of the invention are obtained, a more particular description of the invention will be rendered by reference to specific embodiments thereof which are illustrated in the appended drawings. Understanding that these drawings only depict preferred embodiments of the present invention and are not therefore to be considered limiting in scope, the invention will be described and explained with additional specificity and detail through the use of the accompanying drawings in which.

DETAILED DESCRIPTION OF THE PREFERRED EMBODIMENTS

The present invention is directed towards a metal-semiconductor-metal electrode finger configuration for an optical detector. More particularly, the width of each of the finger electrodes of the photodetector, and the gap therebetween, are tapered along the length of the detector at the same exponential rate as the decay in optical power. In this way, both the photocurrent density in the fingers and the uniformity of the electric field underneath the electrodes are optimized.

Figure 1:
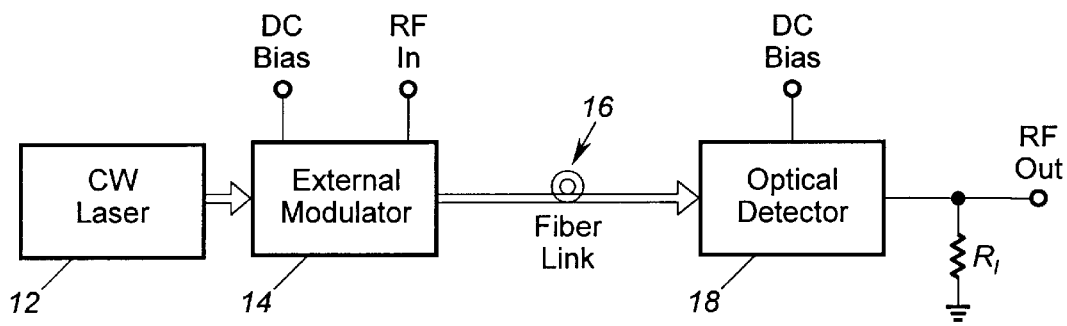
FIG. 1 is a block diagram of an RF photonic link incorporating an optical detector according to the present invention.

Turning now to the drawing figures, FIG. 1 illustrates a microwave fiber optic link 10. The link 10 includes a laser source 12, an external modulator 14, a fiber optic transmission medium 16, and an optical detector 18. The laser source 12 generates a laser beam which is received by the external modulator 14. After modulation, the beam is passed through the fiber optic transmission medium 16 to the optical detector 18. In the optical detector 18, the light energy of the laser source 12 is converted to electrical energy for use in a desired application.

Figure 2:
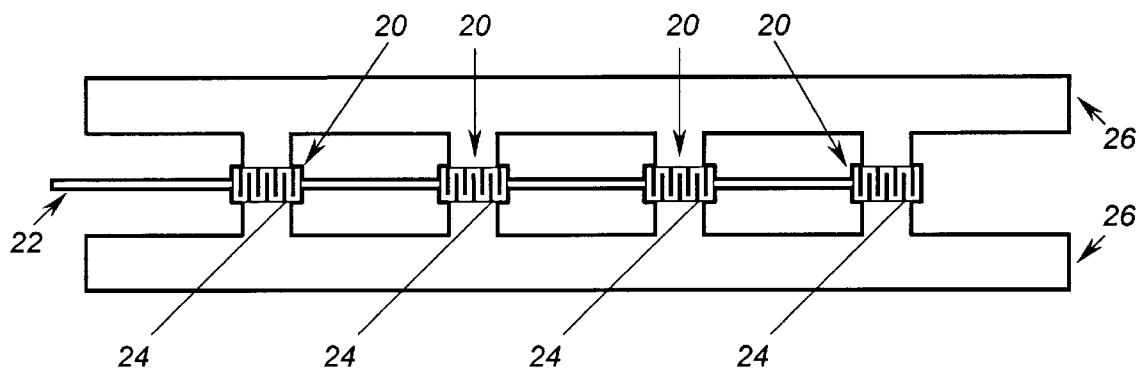
FIG. 2 is a plan view of the optical detector of FIG. 1.

Referring to FIG. 2, the optical detector 18 of FIG. 1 is illustrated in greater detail. The optical detector 18 includes an array of Metal-Semiconductor-Metal (MSM) photodiodes 20 serially connected along the length of the detector 18 by an integrated passive semiconductor optical waveguide 22. The interdigitated electrodes 24 of each of the photodiodes 20 are connected to a Coplanar Strips (CPS) transmission line 26.

In operation, intensity modulated light propagates down the optical waveguide 22 and couples into the MSM of the photodiodes 20 by way of evanescent coupling. As the intensity modulated light is absorbed by the photodiodes 20, a microwave signal is generated at the frequency of the optical intensity modulation and propagates down the transmission line 26. The rate at which the light couples to the active region of the photodiodes 20 and is absorbed can be described by an effective absorption coefficient as shown in equation 1:

$$P(z)=P_o e^{-\alpha_{eff} z} \qquad (1)$$

where z is the direction of propagation along the length of the detector 18, $P_o$ is the incident optical power at z=0, and $\alpha_{eff}$ is the effective optical absorption coefficient.

Figure 3:
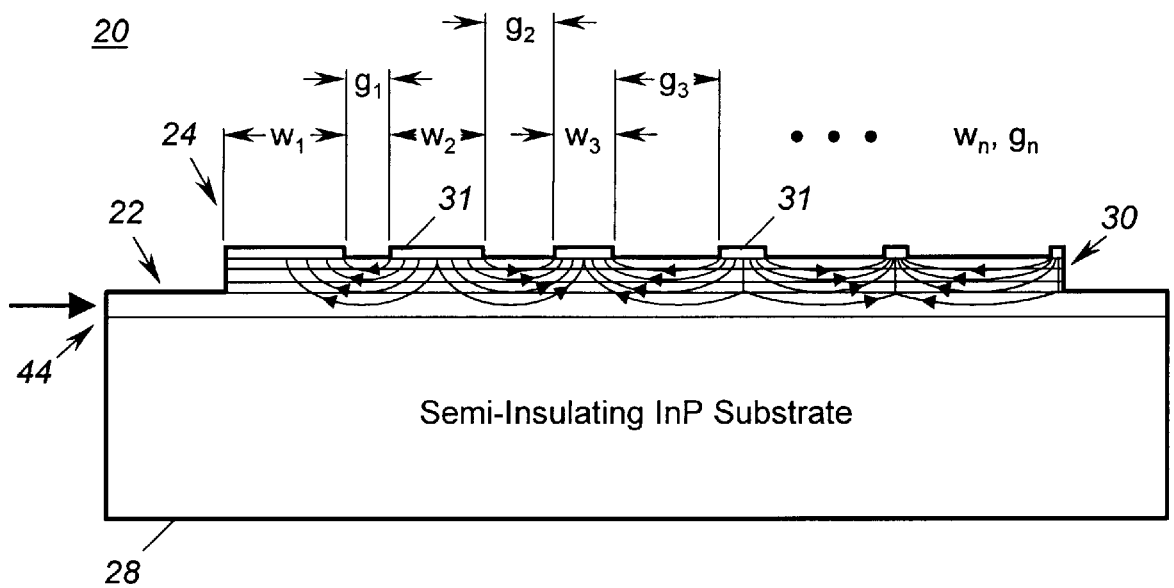
FIG. 3 is a cross-sectional view of an exemplary optical waveguide coupled photodiode of the optical detector of FIG. 2.

Turning now to FIG. 3, a cross-sectional illustration of the optical waveguide coupled photodiode 20 is shown. The optical waveguide 22 is disposed on a semi-insulating substrate 28. An absorber 30 is disposed on the waveguide 22 opposite the substrate 28. Preferably, the semi-insulating substrate is formed of InP while the absorber comprises InGaAs. The electrodes 24 are disposed atop the InAlAs Schotky barrier enhancement layer 40 and form Schottky contacts.

Figure 4:
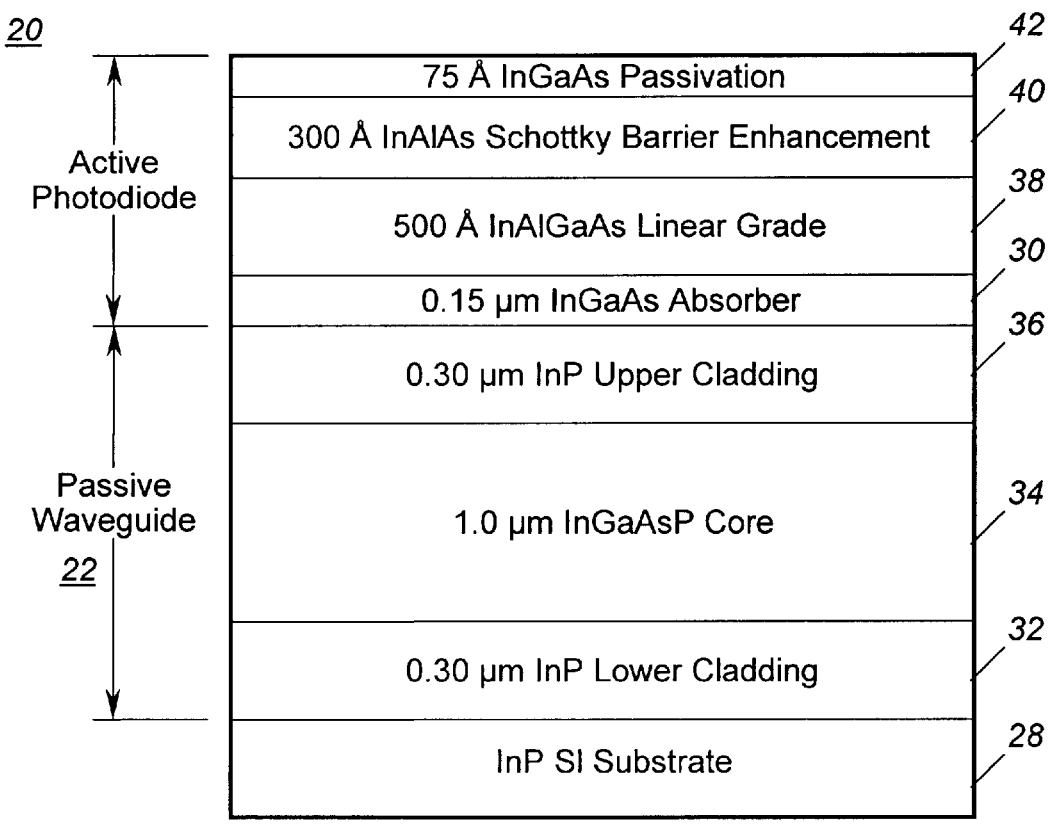
FIG. 4 is a cross-sectional view of an optical waveguide coupled metal-semiconductor-metal electrode according to the present invention.

Referring momentarily to FIG. 4, a more detailed cross-sectional view of the waveguide coupled photodiode 20 is shown. Preferably, the passive waveguide 22 includes a lower cladding 32 of InP disposed on the substrate 28, an InGaAsP core 34 disposed on the lower cladding 32, and an upper cladding 36 disposed on the core 34. The active photodiode 20 preferably includes the InGaAs absorber 30 disposed on the upper cladding 36 of the waveguide 22, a linear grade 38 of InAlGaAs on the absorber 30, an InAlAs Schottky barrier enhancement layer 40 on the linear grade 38, and an InGaAs passivation layer 42 on the enhancement layer 40. The pertinent feature of the layer profile of this configuration is the passive optical waveguide section, which provides a large optical mode such that the input coupling efficiencies from commercially available lens tipped fibers are approximately 90%. Further, the absorber 30 in the active region of the photodiode is kept thin (150 Å) to keep the absorbed optical power density low.

Referring again to FIG. 3, each of the electrode fingers 31 is formed with a predetermined width w. Further, each of the fingers 31 is axially spaced-apart from an adjacent finger 31 by a preselected gap g. Accordingly, the photocurrent in the n$^{th}$ finger 31 can be shown to be:

$$I_{ph,n} = \frac{\eta q}{hv} P_o e^{-(n-1)\alpha_{eff}(w+g)} \left[1 - e^{-\alpha_{eff}(w+g)}\right] \quad (2)$$

where q is the electronic charge, hv is the optical photon energy, η is the internal quantum efficiency of the photodiode 20, w is the width of the fingers 31, and g is the gap between the fingers 31. The photocurrent density in the n$^{th}$ finger 31 is determined by dividing equation (2) by the finger area on the absorbing region:

$$J_{ph,n} = \frac{I_{ph,n}}{\text{finger area}} \quad (3)$$

Figure 7:
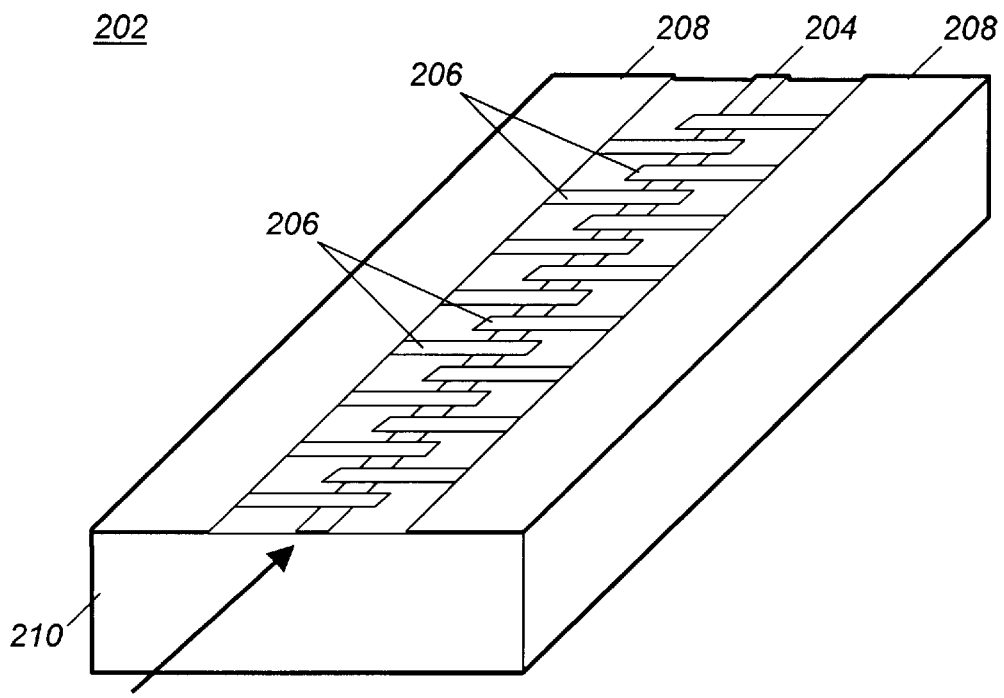
FIG. 7 is a perspective view of a conventional metal-semiconductor-metal photodiode with an integrated optical waveguide and transmission line.
Figure 8:
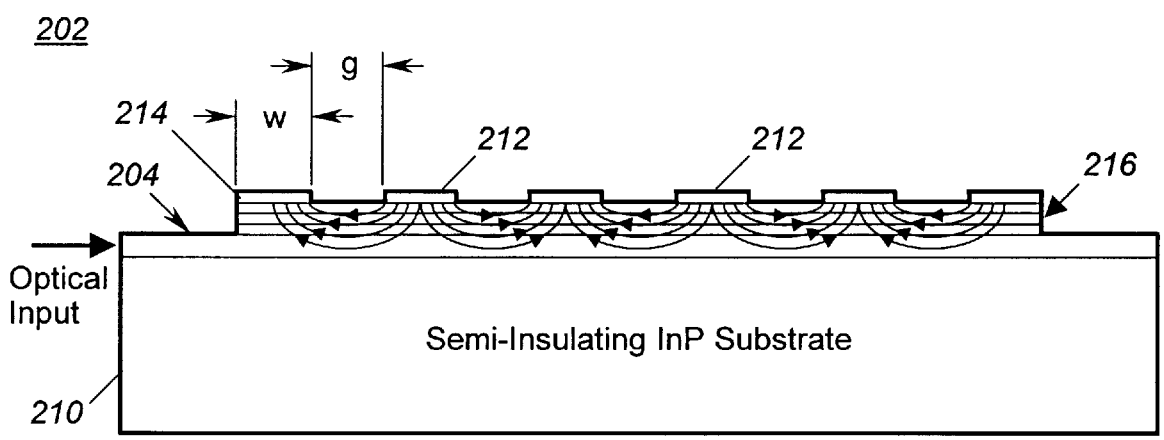
FIG. 8 is a cross-sectional view of the conventional waveguide coupled photodiode of FIG. 7.

Thus, at the input end 44 of the photodiode 20, the optical power density is the highest. As such, the fingers 31 of the electrode 24 are designed to be wide such that the photocurrent density in these fingers is lower than in the conventional (uniform width) electrode case (see FIGS. 7 and 8). As the optical power density decreases down the length of the photodiode 20, so too does the width of the fingers 31. Furthermore, as the width of the fingers 31 decrease, the gap g between adjacent fingers 31 increases. Preferably, the so-called pitch along the photodiode 20, that is, the finger width plus the gap between fingers (w+g), is constant In this way, the photocurrent density in all of the fingers 31 is made constant and the electric field profile underneath the fingers 31 is uniform. The improvement in the electric field profile corresponds to a decrease in the carrier transit times. This results in higher bandwidths and higher 1 dB compression points of the output photocurrent.

Figure 5:
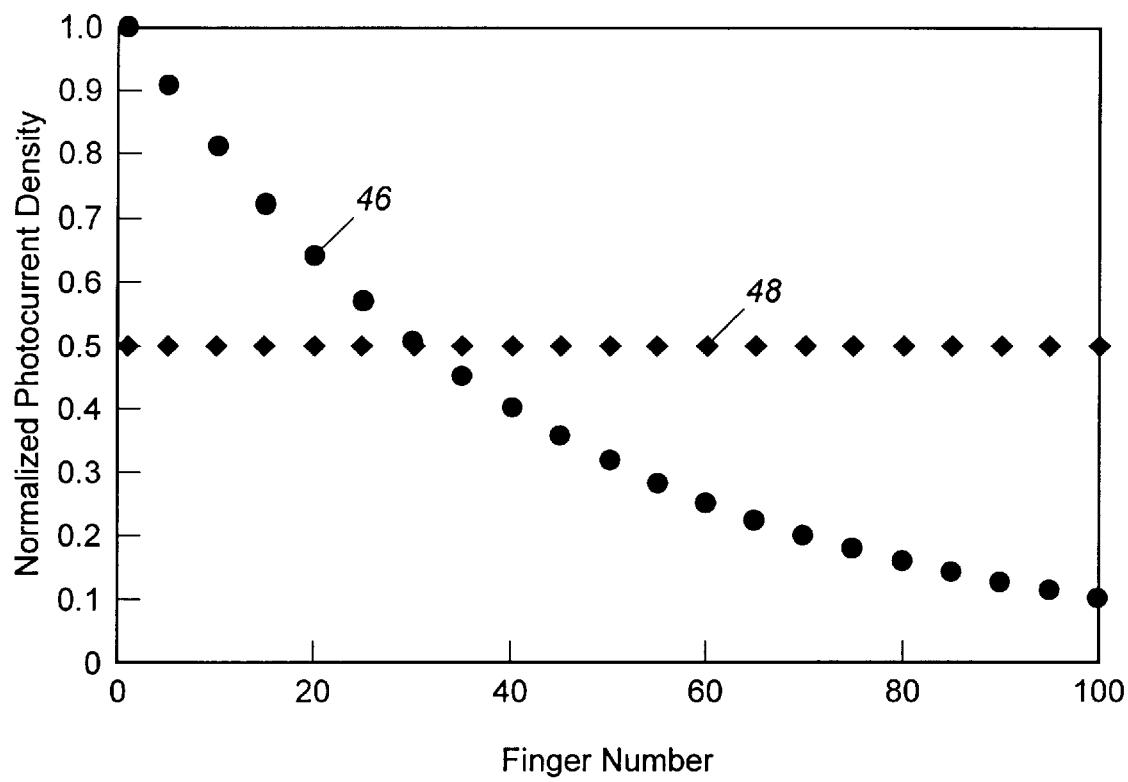
FIG. 5 is a graphic illustration depicting the relationship of normalized photocurrent density to electrode finger number down the length of a photodetector according to the present invention and the prior art.

Referring now to FIGS. 3 and 5 collectively, a theoretical comparison between a conventional uniform photodiode 46 and the tapered metal-semiconductor-metal waveguide photodiode 48 of the present invention is illustrated. The uniform electrode structure consisted of electrode fingers with width, w=1 μm, and gap, g=1 μm. The carrier transit time of this structure is estimated to be 50 ps which corresponds to a bandwidth of 20 GHz. The pitch of the electrode fingers was 2 μm (width+gap).

In the tapered electrode geometry, a constant pitch of 2 μm was maintained while the width of the fingers 31 was adjusted to match the exponential decay in the optical power $(w_1+g_1=w_2+g_2=w_3+g_3 \ldots =w_n+g_n)$. For example, the first finger width was selected to be 1.9 μm with a gap of 0.1 μm and the last finger width was selected to be 0.1 μm with a gap of 1.9 μm. The remaining fingers 31 are continuously tapered at the same exponential rate that the optical power decayed. The definition of metal fingers of these dimensions are well within the capabilities of electron beam photolithographic processes.

As illustrated in FIG. 5, the uniform geometry 46 electrode shows the exponential decay in the photocurrent density that was discussed above. On the other hand, the tapered electrode geometry 48 maintains a constant photocurrent density in all of the fingers 31 and the maximum photocurrent density is approximately half that of the uniform case. Thus, the photocurrent handling of the tapered electrode design 48 is nominally twice that of the conventional uniform electrode geometry 46.

Figure 6:
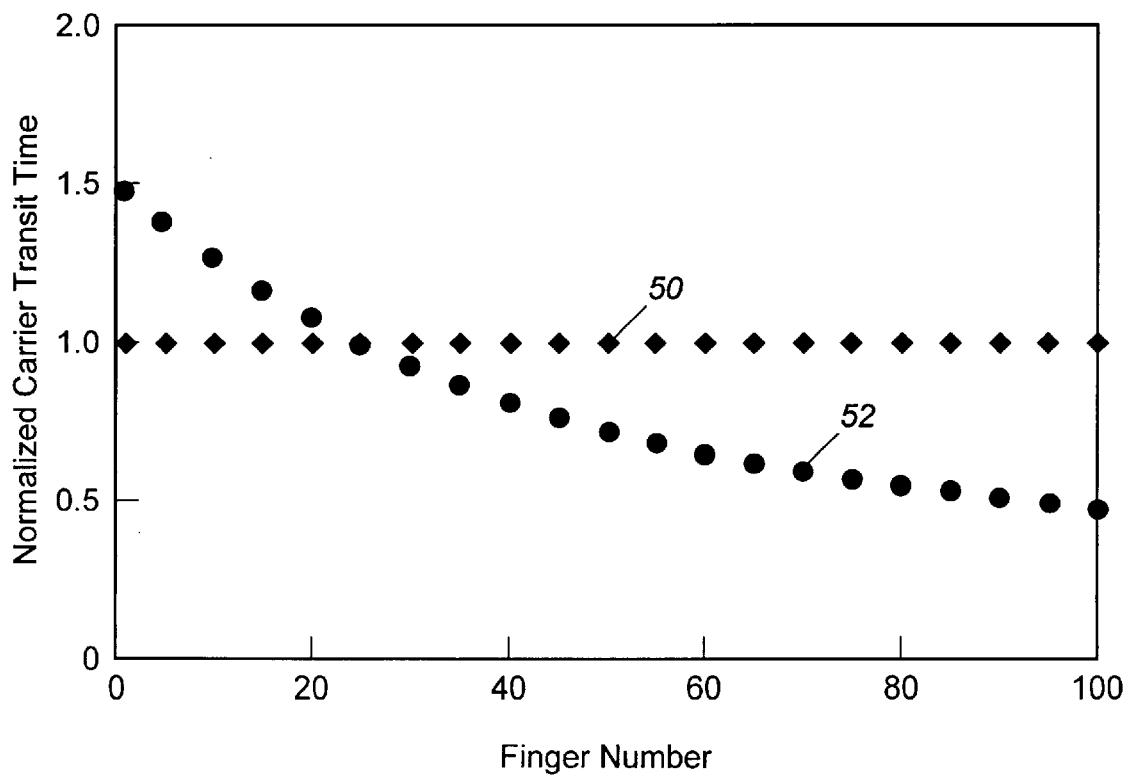
FIG. 6 is a graphic illustration depicting the relationship of normalized carrier transit time to electrode finger number down the length of a photodetector according to the present invention and the prior art.

Referring now to FIGS. 3 and 6 collectively, the curves illustrated show the trends in the carrier transit times versus the position of each finger 31 down the length of a convention uniform electrode photodiode 50 and a tapered electrode photodiode 52. In the uniformly spaced electrode configuration 50, the carrier transit time is constant for all of the fingers. As was mentioned previously, the carrier transit time for a 1 μm wide finger with a 1 μm wide gap was modeled to be $\tau_{uniform}$=50 ps. The plot in FIG. 6 is normalized to $\tau_{uniform}$.

In the tapered design 52, the first few fingers 31 have low gap-to-width aspect ratios so that they can handle the high optical power densities at the input end 44 of the photodiode 20. Due to the low aspect ratio, the areas of low electric field strength underneath the fingers 31 are increased resulting in an increase in the carrier transit time. As shown in FIG. 6, the carrier transit time 52 for the first finger 31 is approximately 1.5 times higher than that in the uniform electrode case 50. As the widths of the fingers 31 are tapered and the aspect ratio improves, the carrier transit times 52 reduce and eventually exceed those of the uniform case 50 until finally the regions of low electric field vanish and the carriers travel at their saturation velocities. At this point, no further improvement in carrier transit time can be obtained by increasing the finger aspect ratio. When properly designed, the conglomerate average of the carrier transit times in the tapered structure can result in bandwidths that are equivalent or exceed those of the uniform structure.

Thus, the present invention provides an improved electrode finger configuration for a metal-semiconductor-metal optical detector. More particularly, the width of each of the finger electrodes of the photodetector, and the gap therebetween, are tapered along the length of the detector at the same exponential rate as the decay in optical power. In this way, both the photocurrent density in the fingers and the uniformity of the electric field underneath the electrodes are optimized.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

What is claimed is:

1. A photodiode comprising:

a substrate;

an optical waveguide disposed on said substrate; and an electrode disposed on said optical waveguide, said electrode including a plurality of electrode fingers having a taper from a first end of said electrode to second end of said electrode, said taper corresponding to an exponential rate of optical power decay though said photodiode.

2. The photodiode of claim 1 wherein said taper further comprises an incrementally decreasing width of said fingers.

3. The photodiode of claim 1 wherein said taper further comprises an incrementally increasing gap between said fingers.

4. The photodiode of claim 1 wherein said taper further comprises an incrementally decreasing width and an incrementally increasing gap between said fingers.

5. The photodiode of claim 1 further comprising a transmission line coupled to said electrode.

6. The photodiode of claim 1 further comprising an absorber disposed between said optical waveguide and said electrode.

7. The photodiode of claim 1 wherein the electrode is a Schottky contact.

8. A photodetector comprising:

a substrate;

an optical waveguide disposed on said substrate; and an array of metal-semiconductor-metal photodiodes coupled to said optical waveguide, said photodiodes including an electrode having a plurality of interdigitated electrode fingers wherein a width of each finger corresponds to an exponential rate of optical power decay through said photodiode.

9. The photodetector of claim 8, wherein a space between adjacent fingers decreases as said width increases.

10. The photodetector of claim 8 further comprising an absorber disposed between said photodiode and said optical waveguide.

11. The photodiode of claim 8 wherein said electrode comprises a Schotky contact.

12. The photodetector of claim 8 further comprising a transmission line coupled to said fingers of said photodiodes.

13. An electrode for a photodiode comprising:

a plurality of axially spaced apart electrode fingers wherein a linear spacing between adjacent fingers increases along a length of said photodiode at an exponential rate corresponding to an exponential rate of optical decay through said photodiode.

14. The electrode of claim 13 wherein a width of adjacent fingers decreases along a length of said photodiode at said exponential rate corresponding to said exponential rate of optical decay through said photodiode.

15. An electrode for a photodiode comprising:

a plurality of axially spaced apart electrode fingers wherein a width of adjacent fingers decreases along a length of said photodiode at an exponential rate corresponding to an exponential rate of optical decay through said photodiode.

16. The electrode of claim 15 wherein a spacing between adjacent fingers increases along a length of said photodiode at said exponential rate corresponding to said exponential rate of optical decay through said photodiode.

* * * * *